United States Patent
Noro et al.

(10) Patent No.: US 7,111,122 B2
(45) Date of Patent: Sep. 19, 2006

(54) ACCESS CIRCUIT WITH VARIOUS ACCESS DATA UNITS

(75) Inventors: Satoshi Noro, Gifu-ken (JP); Shin-ichiro Tomisawa, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 341 days.

(21) Appl. No.: 10/649,366

(22) Filed: Aug. 27, 2003

(65) Prior Publication Data

US 2004/0073770 A1    Apr. 15, 2004

(30) Foreign Application Priority Data

Aug. 28, 2002    (JP)    .............................. 2002-248716

(51) Int. Cl.
*G06F 12/00*    (2006.01)

(52) U.S. Cl. ........................ 711/117; 713/501; 711/201; 711/211

(58) Field of Classification Search ................ 711/117, 711/201, 211; 713/501, 600
See application file for complete search history.

(56) References Cited

U.S. PATENT DOCUMENTS

| 4,766,538 | A | * | 8/1988 | Miyoshi | 710/307 |
| 5,113,369 | A | * | 5/1992 | Kinoshita | 710/307 |
| 5,745,791 | A | * | 4/1998 | Peek et al. | 710/52 |
| 6,466,581 | B1 | * | 10/2002 | Yee et al. | 370/428 |
| 6,486,704 | B1 | * | 11/2002 | Hearn | 326/82 |
| 6,489,805 | B1 | * | 12/2002 | Au et al. | 326/46 |
| 2003/0161351 | A1 | * | 8/2003 | Beverly et al. | 370/535 |

* cited by examiner

*Primary Examiner*—Hiep T. Nguyen
(74) *Attorney, Agent, or Firm*—Fish & Richardson P.C.

(57) ABSTRACT

An access circuit for efficiently accessing a buffer memory in accordance with an instruction from an external circuit. An access data unit for accessing a SDRAM in one operation clock cycle of the access circuit may be switched between one byte, one word, and two words. The switching of the access data unit is performed in accordance with a data unit designation signal generated by decoding address data, which is provided to a control unit, with an address decoder. The memory interface receives a request signal that is in accordance with the data unit designation signal from a request generator and accesses the buffer memory in the access data unit that is in accordance with the request signal.

14 Claims, 4 Drawing Sheets

ACCESS CIRCUIT WITH VARIOUS ACCESS DATA UNITS

CROSS-REFERENCES TO RELATED APPLICATIONS

This application is based upon and claims the benefit of priority from prior Japanese Patent Application No. 2002-248716 filed on Aug. 28, 2002, the entire contents of which are incorporated herein by reference.

BACKGROUND OF THE INVENTION

The present invention relates to an access circuit for accessing a buffer memory in accordance with a command from an external circuit.

Figure 1:
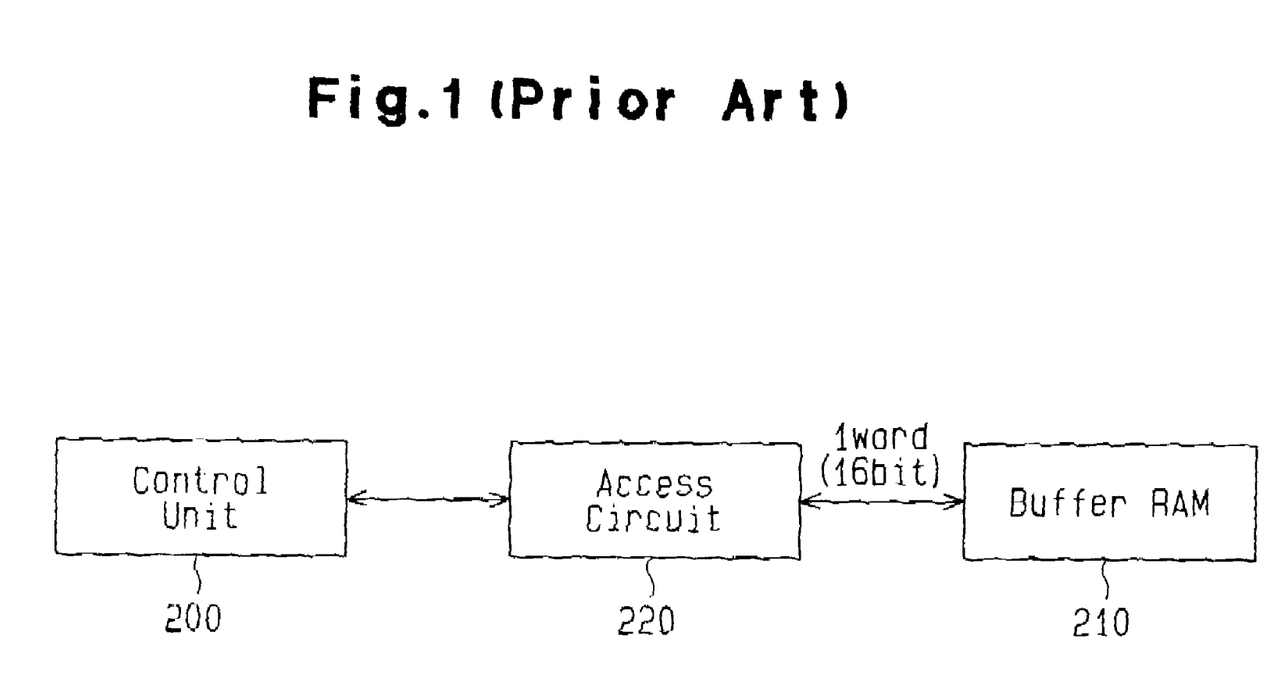
FIG. 1 is a block diagram of a prior art access circuit.

FIG. 1 is a block diagram showing an access circuit 220 and its peripheral circuits, which are used in a prior art digital versatile disc (DVD) recording-reproducing device. A control unit 200 controls each circuit of the recoding-reproducing device. A buffer RAM 210 temporarily stores data, which is recorded to a DVD or which is reproduced from the DVD. The control unit 200 retrieves the data recorded in the buffer RAM 210 via the access circuit 220. The control unit 200 also directly rewrites the data stored in the buffer RAM 210.

When accessing the buffer RAM 210, the control unit 200 designates the head address of the data storage section in the RAM 210 that the control unit 200 is trying to access. From the head address, the access circuit 220 accesses one word of data in the data storage section. In such a manner, to access the buffer RAM 210, the control unit 200 designates the head address of a data storage section and whether it will write data or read data.

The unit of data quantity (data length) transferred between the prior art access circuit 220 and the buffer RAM 210 is fixed at one word. This may lengthen the time for accessing the control unit 200 and the buffer RAM 210.

For example, the following procedures are taken when re-writing one byte of data in the buffer RAM 210. The access circuit 220 first reads one word of data from the buffer RAM 210. The control unit 200 then rewrites just one byte of the read data. The access circuit 220 then writes the rewritten one byte of data and the remaining byte of the read data to the buffer RAM 210. In this manner, to change one byte of data, the access circuit 220 reads one word of data and after the control unit 200 rewrites one byte of the data, writes one word of data to the buffer RAM 210. This increases the time for accessing the buffer RAM 210 and is thus inefficient.

Further, when the control unit 200 successively accesses two words, for each word, the control unit 200 designates the head address of the data that is to be accessed via the access circuit 220. In other words, even if the two words of data are recorded in continuous recording sections of the buffer RAM 210, the control unit 200 must designate addresses twice. This increases the time for accessing the buffer RAM and is thus inefficient.

In addition to a DVD recording-reproducing device, the same problem occurs in an access circuit that accesses a buffer memory in accordance with a command from an external circuit.

SUMMARY OF THE INVENTION

One aspect of the present invention is an access circuit for receiving address data from a control circuit and transferring digital data to and from a buffer memory in a plurality of access data units. The access circuit includes a decoder for decoding the address data. The decoder generates a data unit designation signal for designating one of the access data units in accordance with the address data. An interface accesses the buffer memory from a head address designated by the address data in the access data unit designated by the data unit designation signal.

Another aspect of the present invention is an access circuit for receiving address data from a control circuit and transferring digital data to and from a buffer memory in a plurality of access data units. The access circuit includes a decoder for decoding the address data. The decoder generates a data unit designation signal having a plurality of bits to designate one of the access data units in accordance with the address data. A latch section is connected to the decoder and includes a plurality of latch circuits, each for holding a respective one of the bits. A request generator is connected to the latch section to generate a request signal corresponding to one of the access data units in accordance with the output of the latch section. An interface is connected to the request generator to access the buffer memory from a head address designated by the address data in the access data unit designated by the data unit designation signal.

A further aspect of the present invention is an access circuit for use with an operation clock signal and receiving address data from a control circuit and transferring digital data to and from a buffer memory in a plurality of access data units. The access circuit includes a decoder for decoding the address data. The decoder generates a data unit designation signal for designating one of the access data units in accordance with the address data. An interface accesses the buffer memory from a head address designated by the address data in the access data unit designated by the data unit designation signal. First data transfer lines are connected to the interface within the access circuit. Second data transfer lines are connected between the interface and the buffer memory. The number of the first data transfer lines is two times greater than the number of the second data transfer lines. The frequency of a transfer clock signal used for transferring data between the interface and the buffer memory is two times greater than that of the operation clock signal. The interface switches the number of times the digital data is accessed via the second data transfer lines during a single cycle of the operation clock signal.

A further aspect of the present invention is an access circuit for receiving address data from a control circuit and arranged between the control circuit and a buffer memory. The access circuit includes a decoder for decoding address data received from the control circuit. A request generator generates a request signal that designates one of a plurality of access data lengths in accordance with a decoding result of the decoder. An interface is connected to the request generator to read data from the buffer memory in the access data length designated by the request signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 2:
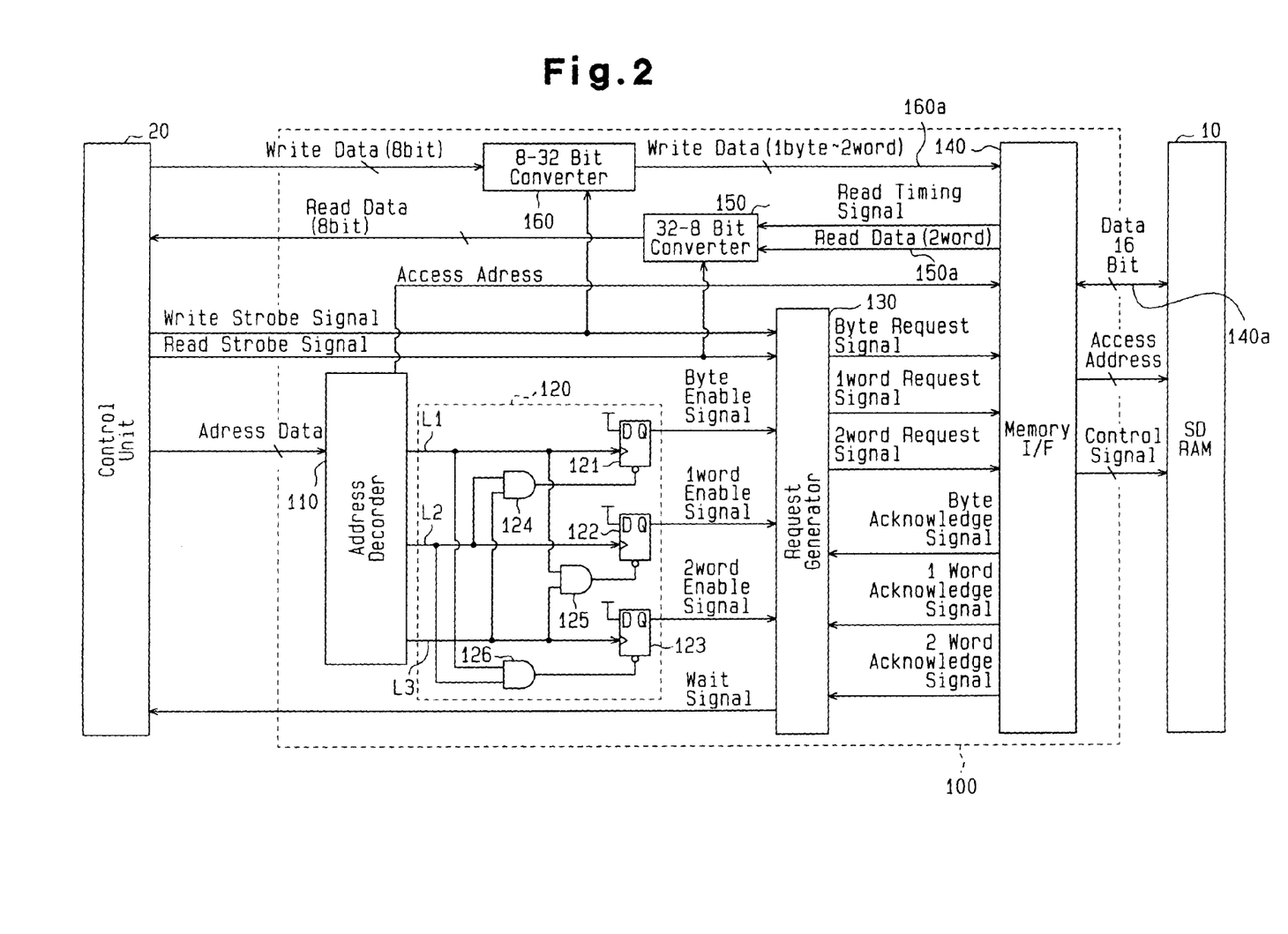
FIG. 2 is a block diagram of an access circuit according to a preferred embodiment of the present invention.

An access circuit 100 according to a preferred embodiment of the present invention will now be discussed. As shown in FIG. 2, the access circuit 100 is arranged between a synchronous dynamic random access memory (SDRAM) 10 and a control unit 20 in a DVD recording-reproducing device.

The SDRAM 10 is a buffer memory for recording data on a DVD or for storing data reproduced from the DVD. The control unit 20 is a microcomputer for controlling each section of the recording-reproducing device. The access circuit 100 accesses the SDRAM 10 in accordance with an instruction from the control unit 20 to write data to the SDRAM 10 and read data from the SDRAM 10.

Digital data is transferred between the control unit 20 and the access circuit 100 in units of one byte (eight bits). The eight bits of data are respectively transferred by eight signal lines, which extend between the control unit 20 and the access circuit 100. Data is transferred between the access circuit 100 and the SDRAM 10 in units of one word (sixteen bits). The sixteen bits of data are respectively transferred by sixteen signal lines, which extend between the access circuit 100 and the SDRAM 10.

The control unit 20 provides the access circuit 100 with address data for designating either a predetermined memory cell in the SDRAM 10 or a predetermined register in the access circuit 100. In accordance with the address data provided from the control unit 20, the access circuit 100 accesses the designated location to read or write data. When provided with a read strobe signal from the control unit 20, the access circuit 100 reads data from the SDRAM 10. When provided with a write strobe signal from the control unit 20, the access circuit 100 writes data to the SDRAM 10.

The control unit 20 designates the unit of data quantity to be accessed when the access circuit 100 accesses the SDRAM 10 as one byte, one word, or two words. In accordance with the unit of the data quantity to be accessed (access data unit), the control unit 20 adjusts the read strobe signal and the write strobe signal. For example, each of the read and write strobe signals is a signal having one pulse when the access data unit is one byte, a signal having two pulses when the access data unit is one word, and a signal having four pulses when the access data unit is two words.

The access circuit 100 will now be discussed.

The access circuit 100 includes an address decoder 110, a latch section 120, a request generator 130, and a memory interface 140.

The address decoder 110 decodes the address data, which is provided from the control unit 20, and designates a register (not shown) of the access circuit 100 or a memory cell of the SDRAM 10. Based on the decoded address data, the address decoder 110 generates a data unit designation signal, which indicates the access data unit of the SDRAM 10, and provides the data unit designation signal to the latch section 120 via signal lines L1 to L3. The address data has certain bits to which information for designating the access data unit of the SDRAM 10 are allocated. The specific bits are decoded to generate the data unit designation signal.

The address decoder 110 generates the data unit designation signal configured by, for example, three bits and provides the latch section 120 with the data unit designation signal. The address decoder 110 normally outputs the data unit designation signal at a high logic level to each of the signal lines L1 to L3. When the address data indicates that the access data unit is one byte, the bit provided to the first signal line L1 has a low logic level. When the address data indicates that the access data unit is one word, the bit provided to the second signal line L2 has a low logic level. When the address data indicates that the access data unit is two words, the bit provided to the third signal line L3 has a low logic level.

In response to the data unit designation signal, the latch section 120 latches the high logic level and provides the request generator 130 with an enable signal in accordance with the access data unit designated by the data unit designation signal. More specifically, a byte enable signal, a one word enable signal, or a two word enable signal goes high when the designated access data unit is one byte, one word, or two words, respectively.

The latch section 120 includes a first flip-flop 121, a second flip-flop 122, and a third flip-flop 123. The first flip-flop 121 uses the bit signal received through the first signal line L1 as an input clock signal and uses the inverted signal of an AND signal (output signal of AND circuit 124), which is produced from the bit signals received through the second and third signal lines L2 and L3, as a reset signal. In synchronism with the rising edge of the input clock signal, the first flip-flop 121 outputs a high logic signal, which its data terminal D constantly receives, as the byte enable signal. The second flip-flop 122 uses the bit signal received through the second signal line L2 as an input clock signal and uses the inverted signal of an AND signal (output signal of an AND circuit 125), which is produced from the bit signals received through the first and third signal lines L1 and L3, as a reset signal. In synchronism with the rising edge of the input clock signal, the second flip-flop 122 outputs the high logic signal, which its data terminal D constantly receives, as the one word enable signal. The third flip-flop 123 uses the bit signal received through the third signal line L3 as an input clock signal and uses the inverted signal of an AND signal (output signal of an AND circuit 126), which is produced from the bit signals received through the first and second signal lines L1 and L2, as a reset signal. In synchronism with the rising edge of the input clock signal, the third flip-flop 123 outputs the high logic signal, which its data terminal D constantly receives, as the two word enable signal.

In accordance with the enable signal (byte, one word, or two word enable signal), the request generator 130 generates a request signal for instructing the unit of the accessed data between the memory interface 140 and the SDRAM 10. The request generator 130 then provides the request signal to the memory interface 140. That is, when receiving the byte enable signal from the latch section 120, the request generator 130 provides the memory interface 140 with a byte request signal. When receiving the one word enable signal, the request generator 130 provides the memory interface 140 with a one word request signal. When receiving the two word enable signal, the request generator 130 provides the memory interface 140 with a two word request signal.

The memory interface 140 mediates the transfer of data between the access circuit 100 and the SDRAM 10. The memory interface 140 transfers data to and from each section in the access circuit 100 in units of two words (32 bits). Further, the memory interface 140 transfers data to and from the SDRAM 10 in units of one word (16 bits). The memory interface 140 also provides the SDRAM 10 with the access address received from the address decoder 110 and a data unit control signal, which is in accordance with the request signal, or the designated address data unit.

The transfer of data between the memory interface 140 and the SDRAM 10 is performed in accordance with a transfer clock signal having a frequency that is two times greater than the frequency of an operation clock signal (operation clock signal of sections other than the memory interface 140 in the access circuit 100) of the access circuit 100. Due to such configuration, the memory interface 140 transfers data and access addresses with the SDRAM 10 and instructs the SDRAM 10 of the access data unit.

When the two word enable signal instructs the access data unit to be two words, the transfer of sixteen bits of data is performed twice during a single cycle of the operation clock signal of the access circuit 100.

When the one word enable signal instructs the access data unit to be one word, the transfer of sixteen bits of data is performed once during a single cycle of the operation clock signal. Although a single cycle of the operation clock signal of the access circuit 100 corresponds to two cycles of the transfer clock signal, which is used for the transfer of data between the memory interface 140 and the SDRAM 10, data is transferred in a single cycle of the transfer clock signal.

When the byte enable signal instructs the access data unit to be one byte, the transfer of sixteen bits of data is performed once during a single cycle of the operation clock signal. More specifically, among the sixteen bits of data, the data written to the SDRAM 10 is allocated to the subject eight bits and arbitrary values are allocated to the remaining eight bits by the memory interface 140. Although the SDRAM 10 receives the sixteen bits of data configured by the subject eight bits of data and the arbitrary eight bits of data, the SDRAM 10 functions to write only the subject eight bits of data at the predetermined addresses. In this manner, the designation of the access data unit is performed only for the write data, and the read data is always transferred in units of two words.

The memory interface 140 also mediates access to the SDRAM 10 from the circuits other than the access circuit 100 in the data recording-reproducing device. Thus, when the circuits other than the access circuit 100 are accessing the SDRAM 10 and the request generator 130 generates a request signal, this command cannot immediately be coped with. In this case, the memory interface 140 does not let an acknowledge signal go high until the memory interface 140 can cope with the instruction of the control unit 20. If the acknowledge signal is not received, the request generator 130 provides the control unit 20 with a wait signal. In response to the wait signal, the control unit 20 temporarily suspends the access command sent to the SDRAM 10 and does not send any new commands to the SDRAM 10.

When the memory interface 140 becomes capable of responding to the command of the control unit 20, the memory interface 140 provides the request generator 130 with the acknowledge signal. More specifically, the acknowledge signal differs depending on the designated access data unit. For example, when the instructed access data unit is one byte, the memory interface 140 provides the request generator 130 with a byte acknowledge signal. When the instructed access data unit is one word, the memory interface 140 provides the request generator 130 with a one word acknowledge signal. When the instructed access data unit is two words, the memory interface 140 provides the request generator 130 with a two word acknowledge signal.

A 32-8 bit converter 150 divides two words (32 bits) of data transferred from the memory interface 140 into four with each quarter having one byte (eight bits) and sequentially transfers the divided four pieces of data to the control unit 20.

Figure 3:
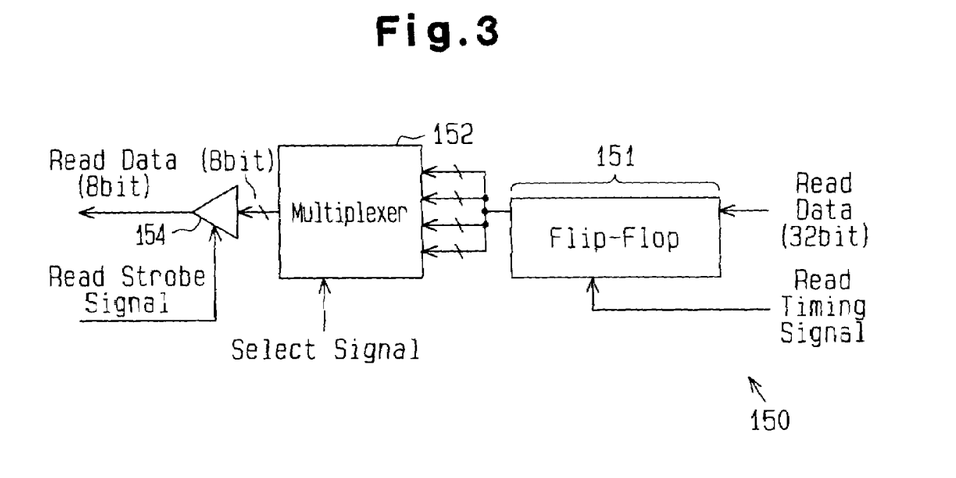
FIG. 3 is a block diagram showing a 32-8 bit converter of FIG. 2.

Referring to FIG. 3, the 32-8 bit converter 150 includes a flip-flop 151, a multiplexer 152, and a tri-state buffer 154. The flip-flop 151 latches the 32 bits of read data provided from the memory interface 140. More specifically, a read timing signal and read data from the memory interface 140 are respectively input to the clock input terminal and the data terminal of the flip-flop 151. In synchronism with the input of the read timing signal, the flip-flop 151 latches the read data, which is input to its data terminal.

Among the 32 bits of read data input to the flip-flop 151, the multiplexer 152 selects the read data in the uppermost eight bits, the read data in the upper 9th bit to the 16th bit, the read data in the upper 17th bit to the 24th bit, or the read data in the lowermost eight bits. The read data is selected in accordance with a select signal from the address decoder 110.

In accordance with the read strobe signal, the tri-state buffer 154 provides the output of the multiplexer 152 to the control unit 20.

As described above, the number of pulses of the read strobe signal is set in accordance with the unit of the data read from the SDRAM 10. Thus, when the data unit read from the SDRAM 10 is one byte, the tri-state buffer 154 provides the control unit 20 with the output of the multiplexer 152 once in synchronism with one pulse of the read strobe signal. When the data unit read from the SDRAM 10 is one word, the tri-state buffer 154 provides the control unit 20 with the output of the multiplexer 152 twice in synchronism with two pulses of the read strobe signal. Further, when the data unit read from the SDRAM 10 is two words, the tri-state buffer 154 provides the control unit 20 with the output of the multiplexer 152 four times in synchronism with four pulses of the read strobe signal.

Figure 4:
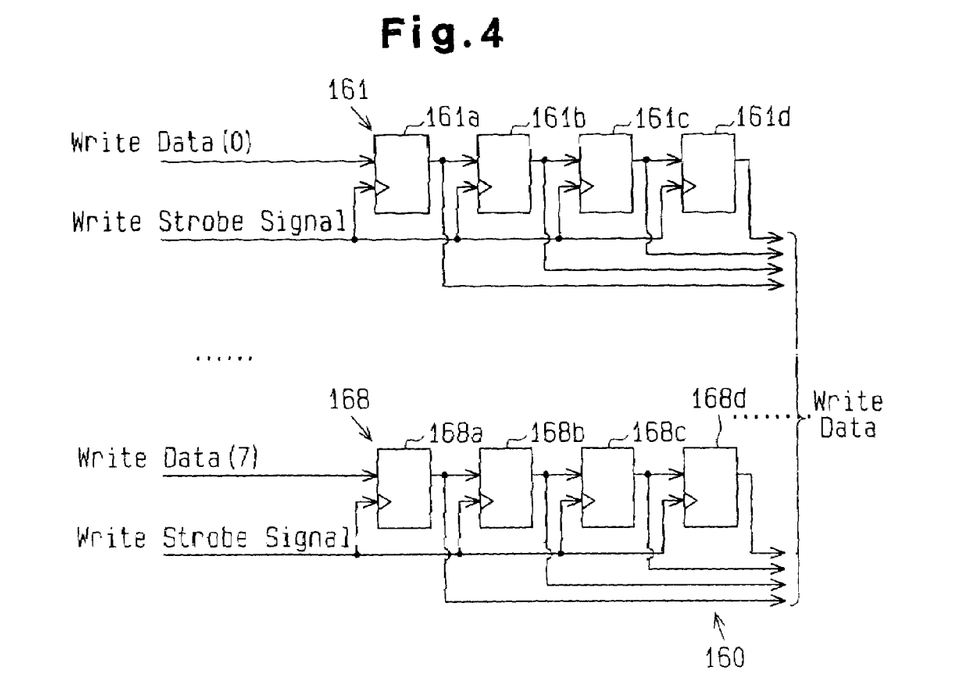
FIG. 4 is a block diagram showing an 8-32 bit converter of FIG. 2.

An 8-32 bit converter 160 converts one byte (eight bits) of data received from the control unit 20 to one byte (eight bits) to two words (32 bits) of data and transfers the converted data to the memory interface 140. Referring to FIG. 4, the 8-32 bit converter 160 includes eight flip-flop sections 161 to 168, which respectively correspond to the bit data of the eight bits of write data. Each of the flip-flop sections 161 to 168 is configured by four flip-flop circuits, which are connected in series to one another. The output stages of the flip-flop sections 161 to 168, that is, the fourth flip-flop circuits 161*d* to 168*d* each latch the write data in the associated one of the first to eight bits. The third flip-flop circuits 161*c* to 168*c* latch the write data in the associated one of the ninth to sixteenth bits. The second flip-flop circuits 161*b* to 168*b* latch the write data in the associated one of the seventeenth to twenty-fourth bits. The input stages, that is, the first flip-flop circuits 161*a* to 168*a* latch the write data in the associated ones of the twenty-fifth bit to the thirty-second bit. The write strobe signal is provided as an input clock signal to each flip-flop section 161 to 168. The flip-flop sections 161 to 168 retrieve data from the respective first flip-flop circuits 161*a* to 168*a* in synchronism with the input clock signal and shifts the data to the flip-flop circuit in the subsequent stage.

As described above, the number of pulses of the write strobe signal is set in accordance with the access data unit of the SDRAM 10. For example, when the access data unit is one byte, the write data is retrieved in the first flip-flop circuits 161*a* to 168*a* once in synchronism with one pulse of the read strobe signal. When the access data unit is one word, the write data is retrieved in the first flip-flop circuits 161*a* to 168*a* twice in synchronism with two pulses of the read strobe signal. Thus, the second flip-flop circuits 161*b* to 168*b* hold the write data of the upper eight bits, and the first flip-flop circuits 161*a* to 168*a* hold the write data of the lower eight bits. When the access data unit is two words, the write data is retrieved in the first flip-flop circuits 161*a* to 168*a* four times in synchronism with four pulses of the read strobe signal. Thus, the fourth flip-flop circuits 161*d* to 168*d*, the third flip-flop circuits 161*c* to 168*c*, the second flip-flop circuits 161*b* to 168*b*, and the first flip-flop circuits 161*a* to 168*a* respectively hold the write data of the upper first to eighth bits, the write data of the upper ninth to sixteenth bits, the write data of the upper seventeenth to twenty-fourth bits, and the lower eight bits.

The accessing of the SDRAM 10 with the access circuit 100 will now be discussed. FIG. 5 is a timing chart of the accessing. An example in which the access data unit has been designated as one byte during the previous access and the access data unit is designated as one word in the current accessing will be described.

Figure 5A:
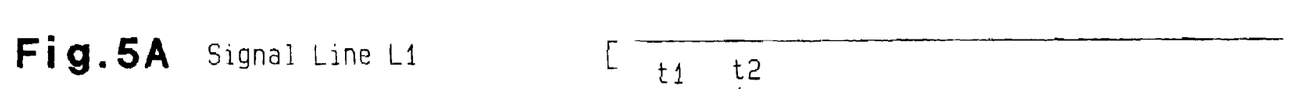
FIGS. 5A to 5J show a timing chart illustrating the operation of the access circuit of FIG. 2.
Figure 5B:
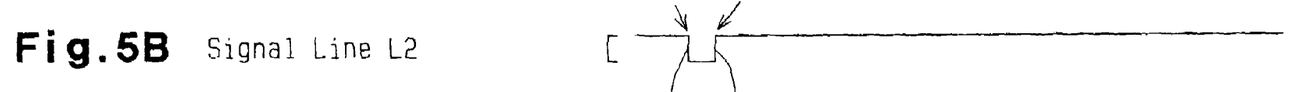
Figure 5C:
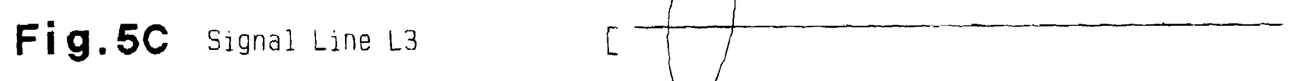
Figure 5D:
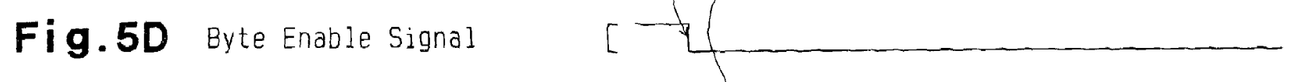
Figure 5E:
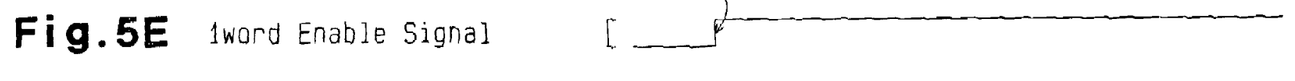
Figure 5F:
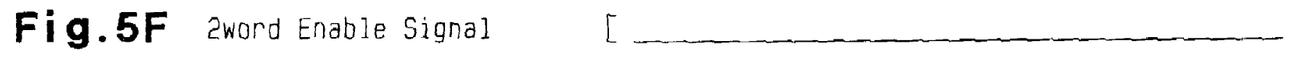

Referring to FIGS. 5A to 5C, first and third signals (bit signals) having a high logic level are normally output to the signal lines L1 to L3 from the address decoder 110. When the address data provided from the control unit 20 designates the access data unit to be one word, the logic level of the second signal provided to the signal line L2 goes low (time t1). In synchronism with the falling edge of the second signal, the one byte enable signal provided from the flip-flop 121 of FIG. 2 goes low (FIG. 5D). At time t2, the second signal goes high. In synchronism with the rising edge of the second signal, the one word enable signal goes high (FIG. 5E).

Figure 5G:
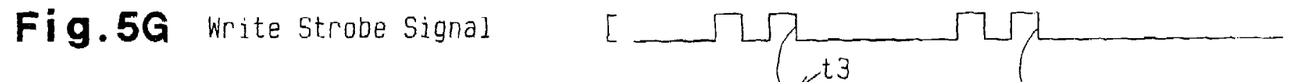
Figure 5H:
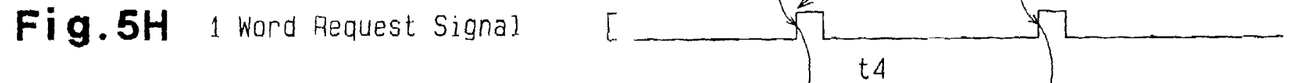
Figure 5I:
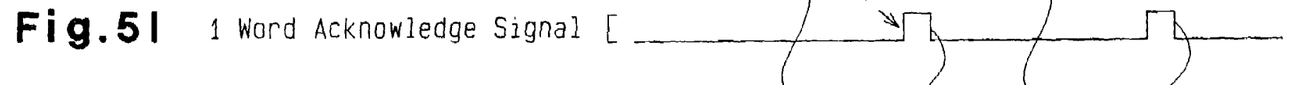
Figure 5J:
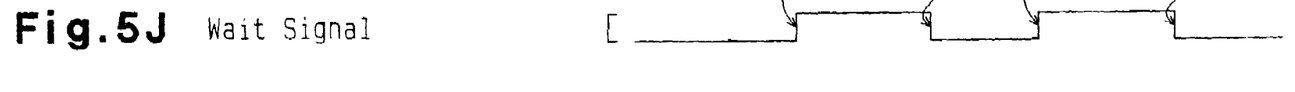

As a result, in the request generator 130, the read strobe signal or the write strobe signal enters a standby state. Referring to FIG. 5G, when a write strobe signal corresponding to the one word enable signal is input, the request generator 130 counts the number of pulses of the write strobe signal. Since the number of pulses is two, the request generator 130 generates a one word request signal at time t3 (FIG. 5H). However, when the memory interface 140 cannot immediately respond to the one word access request, the memory interface 140 does not output the one word acknowledge signal. Thus, the request generator 130 provides the control unit 20 with the wait signal (FIG. 5J). When the memory interface 140 becomes capable of responding to the one word access request, the memory interface 140 generates the one word acknowledge signal at time t4 (FIG. 5I). In response to the one word acknowledge signal, the request generator 130 causes the wait signal to go low.

Then, when the control unit 20 designates the access data unit to be one word, the control unit 20 outputs the access address data, which designates the head address that is to be accessed, and two pulses of the write strobe signal again as shown in FIG. 5G. In this state, as shown in FIG. 5E, the latch section 120 holds the output of the one word enable signal. Thus, the control unit 20 does not have to generate and output further address data for designating the access data unit. This shortens the processing time for accessing the SDRAM 10 from the control unit 20.

The preferred embodiment has the advantages described below.

(1) When an external unit designates the unit of the accessed data in the SDRAM 10 for a single operation clock cycle of the access circuit 100 as one byte, one word, or two words, the address decoder 110 outputs the data unit designation signal, which instructs accessing in accordance with the designated data unit. As a result, even if the control unit 20 generates a one byte access request, such a request may appropriately be coped with. Further, when the control unit 20 generates a two word access request for accessing continuous recording sections of the SDRAM 10, the head address of the data that is to be accessed does not have to be designated each time one word is accessed. This shortens the processing time for accessing the SDRAM 10 from the control unit 20.

(2) In addition to designating a predetermined memory cell of the SDRAM 10 and a predetermined register in the access circuit 100, the address data is used to designate the access data unit. This shortens the time required for the control unit 20 to access the SDRAM 10.

(3) The access circuit 100 includes a latch section 120 for latching information related to the access data unit that is decoded by the address decoder 110. Thus, when the control unit 20 instructs plural accesses of the same access data unit, instructions for the access data unit of the second access are not necessary.

(4) In the access circuit 100, the number of signal lines (150*a* and 160*a*) for transferring data to and from the memory interface 140 corresponds to two words, and the number of signal lines (140*a*) for transferring data between the memory interface 140 and the SDRAM 10 is in accordance with one word. Further, the frequency of the transfer clock signal used to transfer data between the memory interface 140 and the SDRAM 10 is two times greater than the frequency of the operation clock signal of the access circuit 100. This properly switches the access data unit between one byte, one word, and two words. Further, since only the transfer clock signal has a frequency that is greater than that of the transfer clock signal, the design requirements of the access circuit 100 are reduced.

It should be apparent to those skilled in the art that the present invention may be embodied in many other specific forms without departing from the spirit or scope of the invention. Particularly, it should be understood that the present invention may be embodied in the following forms.

The memory interface 140 does not have to function to mediate access to the SDRAM 10 by other circuits of the data recording-reproducing device. In such a case, the memory interface 140 does not have to output the acknowledge signal. Further, the request generator 130 does not have to output the wait signal.

The configuration of the latch section 120 is not limited to that shown in FIG. 2.

The latch section 120 may be eliminated, and a signal including the information of the access data unit that is decoded by the address decoder 110 may directly be provided to the request generator 130.

The request generator 130 may be eliminated, and the memory interface 140 may be provided with a function for switching the access data unit in accordance with the data unit designation signal from the address decoder 110.

The configurations of the 32-8 bit converter 150 and the 8-32 converter 160 are not limited to those shown in FIGS. 3 and 4.

As long as the access circuit 100 is provided with a function for switching the access data unit in accordance with a designation by an external circuit, the selected unit of the data accessed between the access circuit 100 and the SDRAM 10 does not have to be fixed to the three units of one byte, one word, and two words.

The buffer memory subject to access by the access circuit 100 is not limited to the SDRAM 10.

The access circuit 100 does not have to be used in the DVD data recording-reproducing device and may be used in an optical disc recording device or reproducing device as long as the access circuit 100 is a circuit for accessing a DRAM.

The present examples and embodiments are to be considered as illustrative and not restrictive, and the invention is not to be limited to the details given herein, but may be modified within the scope and equivalence of the appended claims.

What is claimed is:

1. An access circuit for receiving address data from a control circuit and transferring digital data to and from a buffer memory in a plurality of access data units, the access circuit comprising:
    a decoder for decoding the address data, wherein the decoder generates a data unit designation signal for designating one of the access data units in accordance with the address data; and
    an interface for accessing the buffer memory from a head address designated by the address data in the access data unit designated by the data unit designation signal, wherein the frequency of a transfer clock signal used for transferring data between the interface and the buffer memory is greater than that of an operation clock signal of the access circuit.

2. The access circuit according to claim 1, further comprising:
    a request generator for generating a plurality of request signals, each corresponding to a respective one of the access data units, wherein the request generator provides the interface with one of the request signals in accordance with the access data unit designated by the data unit designation signal, and the interface accessing the buffer memory in the access data unit corresponding to the one of the request signals.

3. The access circuit according to claim 2, wherein the data unit designation signal has a plurality of bits, the access circuit further comprising:
    a latch section connected between the decoder and the request generator, wherein the latch section includes a plurality of latch circuits, each holding a respective one of the bits, and the request generator generating one of the request signals in accordance with the output of the latch section.

4. The access circuit according to claim 1, wherein the plurality of access data units include one byte, one word, and two words.

5. The access circuit according to claim 1, wherein the decoder is operated according to the operation clock signal and the interface is operated according to the transfer clock signal.

6. An access circuit for use with an operation clock signal, receiving address data from a control circuit, and transferring digital data to and from a buffer memory in a plurality of access data units, the access circuit comprising:
    a decoder for decoding the address data, wherein the decoder generates a data unit designation signal for designating one of the access data units in accordance with the address data; and
    an interface for accessing the buffer memory from a head address designated by the address data in the access data unit designated by the data unit designation signal, wherein first data transfer lines are connected to the interface within the access circuit and second data transfer lines are connected between the interface and the buffer memory, and the number of the first data transfer lines is two times greater than the number of the second data transfer lines, and the frequency of a transfer clock signal used for transferring digital data between the interface and the buffer memory is two times greater than that of the operation clock signal of the access circuit; and
    wherein the interface switches the number of times the digital data is accessed via the second data transfer lines during a single cycle of the operation clock signal.

7. The access circuit according to claim 6, wherein the interface changes the access data unit by changing the quantity of clock pulses of the transfer clock signal used for a single access.

8. An access circuit for receiving address data from a control circuit and arranged between the control circuit and a buffer memory, the access circuit comprising:
    a decoder for decoding the address data received from the control circuit;
    a request generator for generating a request signal that designates one of a plurality of access data lengths in accordance with a decoding result of the decoder; and
    an interface connected to the request generator to read data from the buffer memory in the access data length designated by the request signal, wherein the frequency of a transfer clock signal used for transferring digital data between the interface and the buffer memory is greater than that of an operation clock signal of the access circuit.

9. The access circuit according to claim 8, wherein the interface accesses the buffer memory in each of the access data lengths.

10. The access circuit according to claim 8, wherein the decoder generates a data unit designation signal indicating a decoding result of the address data.

11. The access circuit according to claim 10, wherein the request generator provides the interface with the request signal that is selected from a plurality of request signals in accordance with the data unit designation signal.

12. The access circuit according to claim 11, wherein the plurality of access data lengths include one byte, one word, and two words.

13. The access circuit according to claim 8, wherein the address data received by the decoder is generated by the control circuit in accordance with access data length of digital data to be written in the buffer memory.

14. An access circuit for receiving address data from a control circuit and transferring digital data to and from a buffer memory in a plurality of access data units, the access circuit comprising:
    a decoder for decoding the address data, wherein the decoder generates a data unit designation signal having a plurality of bits to designate one of the access data units in accordance with the address data;
    a latch section connected to the decoder and including a plurality of latch circuits, each for holding a respective one of the bits;
    a request generator connected to the latch section to generate a request signal corresponding to one of the access data units in accordance with the output of the latch section; and an interface connected to the request generator to access the buffer memory from a head address designated by the address data in the access data unit designated by the data unit designation signal, wherein the frequency of a transfer clock signal used for transferring digital data between the interface and the buffer memory is greater than that of an operation clock signal of the access circuit.

* * * * *